US010629504B2

(12) United States Patent
Ogawa et al.

(10) Patent No.: US 10,629,504 B2
(45) Date of Patent: Apr. 21, 2020

(54) DIE EDGE CRACK AND DELAMINATION DETECTION

(71) Applicant: AVAGO TECHNOLOGIES INTERNATIONAL SALES PTE. LIMITED

(72) Inventors: Ennis T. Ogawa, Irvine, CA (US); Yusang Lin, Irvine, CA (US); Liming Tsau, Irvine, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 342 days.

(21) Appl. No.: 15/586,050

(22) Filed: May 3, 2017

(65) Prior Publication Data

US 2017/0323835 A1 Nov. 9, 2017

Related U.S. Application Data

(60) Provisional application No. 62/331,078, filed on May 3, 2016.

(51) Int. Cl.
*H01L 21/66* (2006.01)
*H01L 23/58* (2006.01)
*H01L 23/522* (2006.01)
*H01L 21/78* (2006.01)
(Continued)

(52) U.S. Cl.
CPC .......... *H01L 22/34* (2013.01); *G01R 31/2858* (2013.01); *H01L 21/78* (2013.01); *H01L 23/5228* (2013.01); *H01L 23/562* (2013.01); *H01L 23/585* (2013.01); *H01L 2924/3512* (2013.01); *H01L 2924/35121* (2013.01)

(58) Field of Classification Search
CPC ....... H01L 22/34; H01L 23/562; H01L 21/78; H01L 23/5228; H01L 23/585; H01L 2924/35121; H01L 2924/3512; G01R 31/2858

See application file for complete search history.

(56) References Cited

U.S. PATENT DOCUMENTS 9,337,087 B1 * 5/2016 Zhang ................. H01L 23/5223
2005/0212147 A1 * 9/2005 Nishizawa ......... G01R 31/2884
257/786

(Continued)

*Primary Examiner* — Patrick Assouad
*Assistant Examiner* — Feba Pothen
(74) *Attorney, Agent, or Firm* — Xsensus LLP

(57) ABSTRACT

A die edge crack and delamination detection device includes a semiconductor device including an IC active area surrounded by at least one mechanical protection barrier (MPB); one or more metallization layers stacked on the IC active area; a plurality of passive electronic devices placed within the metallization layers at respective predetermined distances from the MPB; and a detection circuit having circuitry. The circuitry is configured to determine a specific metallization layer in which a crack or a delamination is encroaching from an edge of the semiconductor device, determine a lateral distance of a lead end of the crack or the delamination from the MPB, and determine a rate of approach of the crack or the delamination encroaching towards the MPB, via a nominal change in an electrical measurement of at least one of the passive electronic devices.

20 Claims, 13 Drawing Sheets

Topside View

Dimensions are given in μm

Dielectric layers have been removed

(51) Int. Cl.
H01L 23/00 (2006.01)
G01R 31/28 (2006.01)

(56) References Cited

U.S. PATENT DOCUMENTS

2011/0266541 A1* 11/2011 Yang .................. H01L 22/32
 257/48
2013/0076347 A1* 3/2013 Toshida ................ G01R 33/10
 324/219

* cited by examiner

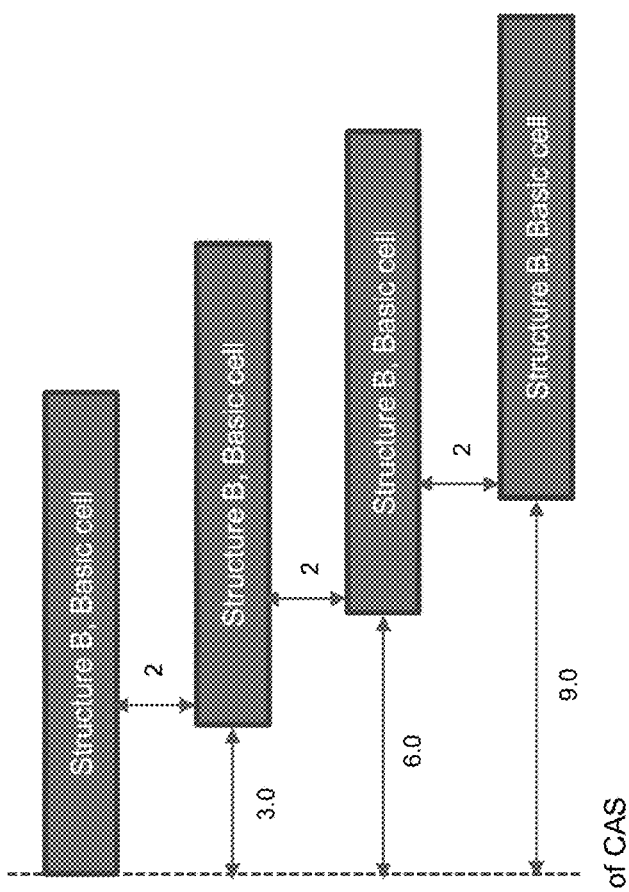
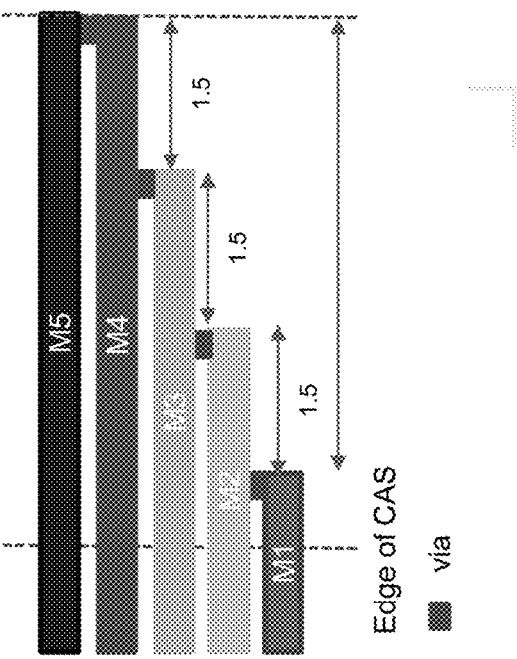
Fig. 6B
Fig. 6A

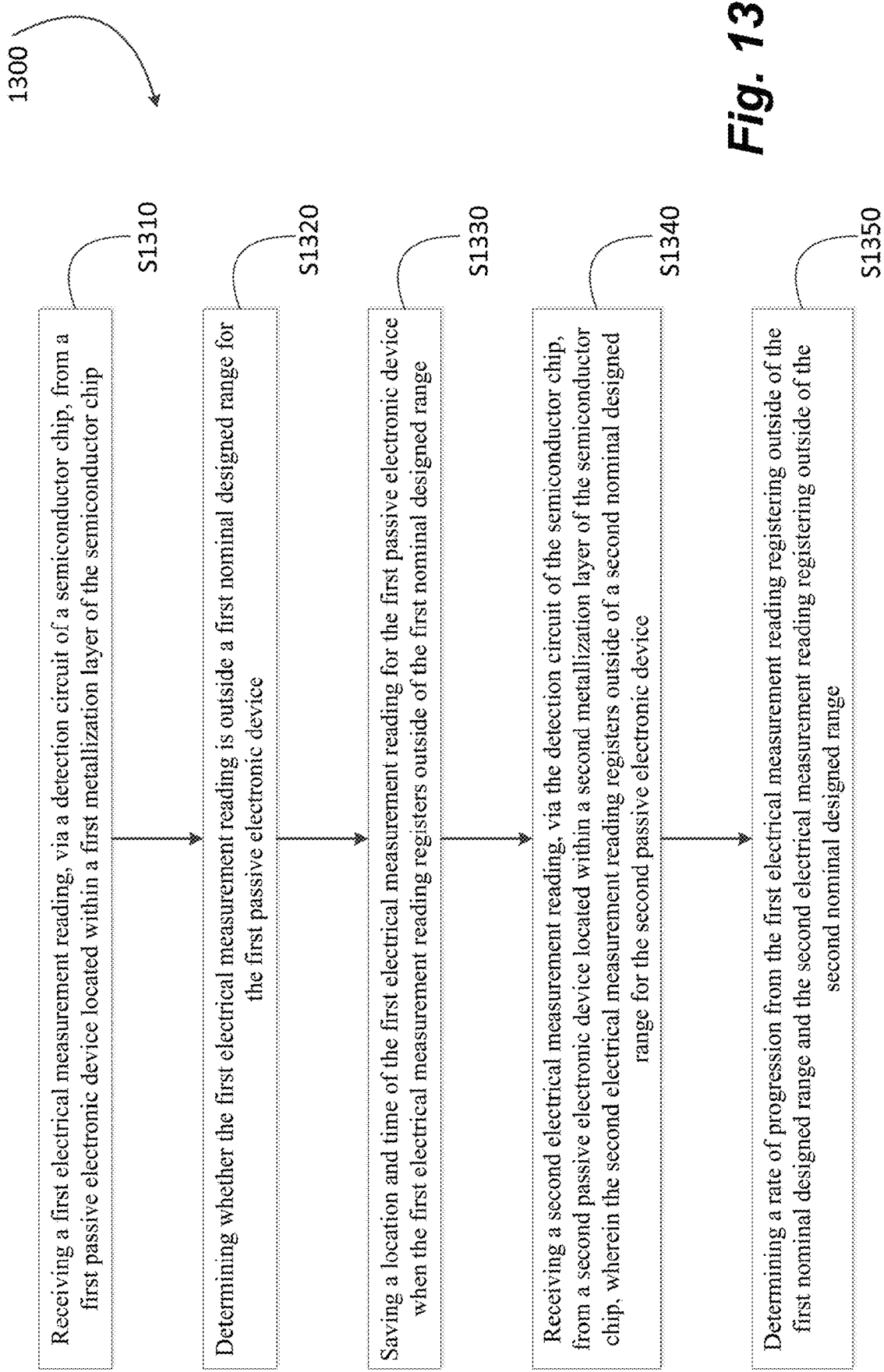

DIE EDGE CRACK AND DELAMINATION DETECTION

CROSS REFERENCE TO RELATED APPLICATIONS

This application claims priority to U.S. provisional application Ser. No. 62/331,078, filed May 3, 2016, which is incorporated in its entirety by reference herein.

BACKGROUND

Technical Field

The present disclosure is directed to structures and methods for detecting the extent and scope of Die Edge Crack (DEC) penetration and Die Edge Delamination (DED) penetration into a semiconductor die before it reaches a potentially critical level of damage to the semiconductor die.

Description of the Related Art

Die Edge Crack (DEC) and Die Edge Delamination (DED) detection are problematic in that no clear methodology exists to properly assess the risk associated with a given level of damage. A semiconductor die is prone to DEC/DED damage because micro-scale pre-damage is generated at the die edge during assembly and packaging processes of laser grooving and/or dicing steps.

A semiconductor die can have many levels of interconnect metallization. As a result, cracks can form at the die edge in any of the metallization levels and propagate towards the internal portions of the semiconductor die, which can trigger catastrophic failure to semiconductor die function. Such failure can be triggered either by physical damage caused by the crack leading to open/short/leakage issues, or by Back-end-of-Line (BeoL) dielectric breakdown of low-k dielectrics used in advanced CMOS processes due to excessive moisture ingress into the BeoL.

DEC/DED is fundamentally problematic because it is found primarily after a given semiconductor die product has suffered sufficient DEC/DED damage and the hermeticity is lost to the external ambient. A Seal Ring (SR) and/or other Crack Stop (CS) or Crack Arrest Structure (CAS) can be used to prevent DEC/DED penetration through a semiconductor die, but confirmation of the semiconductor die integrity needs to be confirmed independently because the SR/CAS is usually electrically inactive to avoid negative interactions with internal semiconductor die functionality.

Simple detectors such as perimeter via chain and capacitor-based detectors can trigger failure when a crack has broken through it (along some portion of the simple structure that surrounds the semiconductor die), but they only track the existence of failure at a given location on the die edge. Typically, such detectors arc designed to be placed interior to the semiconductor die within the protection boundary provided by the SR/CAS. DEC/DED detection then occurs after the SR/CAS has failed. Therefore, such simple detectors are not able to identify the progress of the crack and thus, do not indicate the potential of such a DEC/DED that can lead to semiconductor die failure.

The "background" description provided herein is for the purpose of generally presenting the context of the disclosure. Work of the presently named inventors, to the extent it is described in this background section, as well as aspects of the description which may not otherwise qualify as conventional art at the time of filing, are neither expressly nor impliedly admitted as conventional art against the present disclosure.

SUMMARY

One embodiment includes a die edge crack and delamination detection device includes a semiconductor device including an integrated circuit (IC) active area surrounded by at least one mechanical protection barrier (MPB); one or more metallization layers stacked on the IC active area; a plurality of passive electronic devices placed within the one or more metallization layers at respective predetermined distances from the MPB; and a detection circuit having circuitry. The circuitry is configured to determine a specific metallization layer in which a crack or a delamination is encroaching from an edge of the semiconductor device, determine a lateral distance of a lead end of the crack or the delamination from the MPB, and determine a rate of approach of the crack or the delamination encroaching towards the MPB, wherein determining the specific metallization layer, the lateral distance, and the rate of approach are deter mined via a nominal change in an electrical measurement of at least one of the passive electronic devices.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 6A is a diagram of a side view of an exemplary DEC/DED detection Structure B, according to certain embodiments;

FIG. 6B is a top view of a DEC/DED detection structure of Structure B cells, according to certain embodiments;

FIG. 13 is a flowchart of an exemplary method of detecting a crack or delamination, according to certain embodiments.

DETAILED DESCRIPTION

The following descriptions are meant to further clarify the present disclosure by giving specific examples and embodiments of the disclosure. These embodiments are meant to be illustrative rather than exhaustive. The full scope of the disclosure is not limited to any particular embodiment disclosed in the specification, but rather is defined by the claims.

In the interest of clarity, not all of the features of the implementations described herein are shown and described in detail. It will be appreciated that in the development of any such actual implementation, numerous implementation-specific decisions will be made in order to achieve the developer's specific goals, such as compliance with application- and business-related constraints, and that these specific goals will vary from one implementation to another and from one developer to another.

Embodiments described herein provide systems of and methods for detection of multi-level Die Edge Crack (DEC) propagation. The level of damage can be assessed to determine a given life expectancy of the semiconductor die.

The three-dimensional character of die edge crack detectors are described herein, which enable the detection of crack layer location on the semiconductor die, a progression of the crack, and a crack progression rate. In addition, die edge delamination (DED) is also detected using embodiments described herein. Thus, systems and methods described herein can detect cracks and delamination in real time and for extended periods, determine where a potential crack has formed in terms of its distance from the Seal Ring (SR) and/or other Crack Arrest Structure (CAS), and the metallization level location. Systems and methods can also determine the potential of a given amount of DEC/DED damage that can lead to field reliability risk, and thereby enable monitoring of the "safe operation" of a given semiconductor die in the field.

Figure 1:
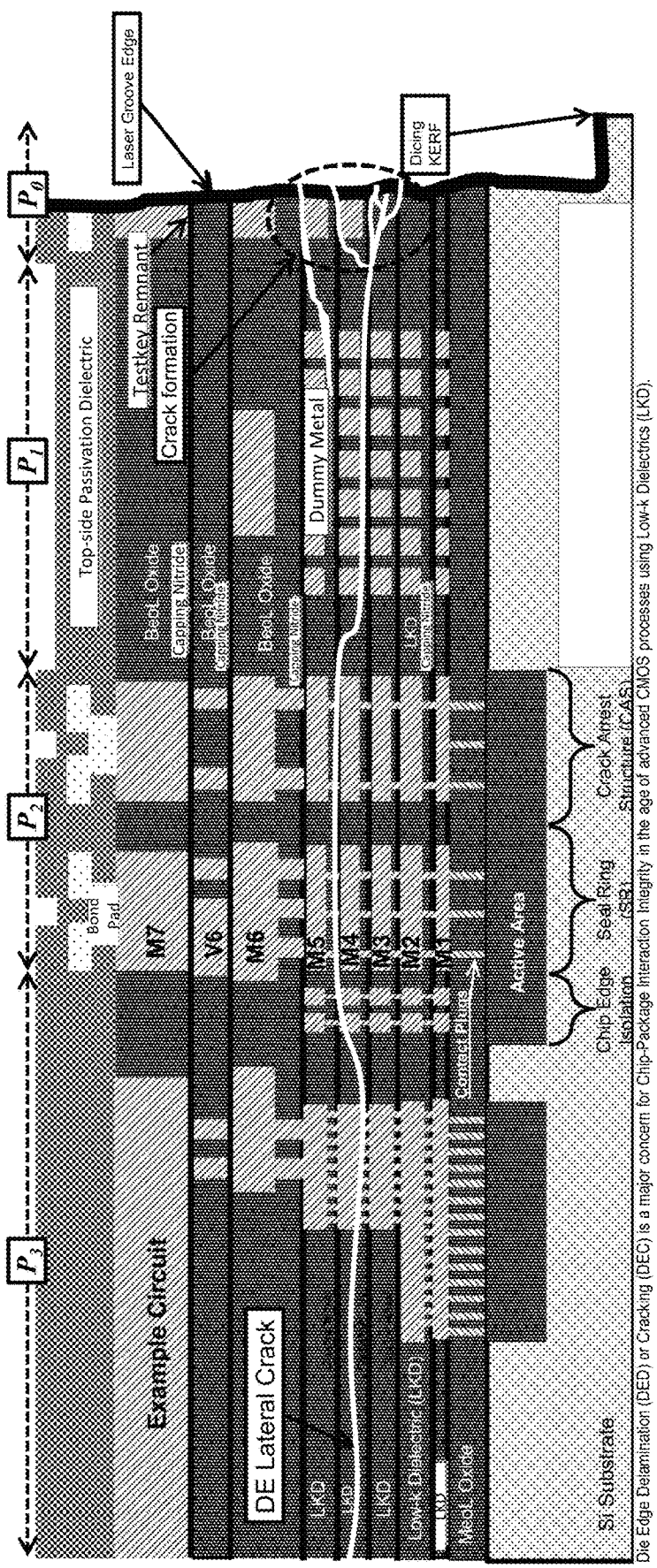
FIG. 1 is a diagram of an exemplary semiconductor die with a die edge crack, according to certain embodiments.

FIG. 1 is a diagram of an exemplary semiconductor die with a lateral die edge crack, according to certain embodiments. DED and DEC are a major concern for Chip-Package Interaction Integrity in the age of advanced CMOS processes using low-k dielectrics (LKD). DEC/DED usually occurs within the Back-end-of-Line (BeoL) region, and can be divided into four phases as illustrated in FIG. 1 as $P_0$, $P_1$, $P_2$, $P_3$, which are defined as follows.

$P_0$: Crack Nucleation, Lateral Crack Formation, and Stabilization; $P_0$ is likely not rate-limiting for the time-to-failure, $t_{Fail}$.

$P_1$: Lateral Crack Growth along die edge; $P_1$ usually occurs after formation and is accelerated by high ambient humidity and external mechanical stress.

$P_2$: Mechanical Protection Barrier (which includes both SR and CAS) Failure is likely the rate-limiting step for DED failure.

$P_3$: Crack Propagation into die interior (Chip failure eminent); circuits generally fail readily after ambient exposure.

DEC and DED that occur after Assembly & Packaging (A&P) of individual silicon chips are major industry-wide problems. DEC and DED can occur simultaneously and randomly along the edge of a semiconductor die, but it is affected by the local environment of the die edge during A&P.

As scaling of chips to LKDs occurs, the overall mechanical strength of the semiconductor die decreases because the mechanical strength of LKDs is much weaker than oxide glasses that were used in earlier technologies. Thus, DEC and DED issues are expected to increase as scaling occurs towards a five nm node and smaller. Once a DEC or DED is formed, crack propagation or delamination begins at a rate determined by the ambient conditions, which apply loading and environmental stresses on a crack or delamination. The DEC/DED may not be detected if the DEC/DED has not reached a certain point or location, but it can still lead to significant risk for early field failure. Without accurate representation of the extent of a DEC/DED at multiple points along the chip edge, the level of risk for a given chip being assessed during or just after the manufacturing stages cannot be easily assessed.

If a DEC/DED penetrates through the hermetic protection barriers on the semiconductor die, earlier failure of the semiconductor die can be expected. Several factors play a role in accelerating the rate of failure due to loss of environmental protection for the semiconductor die, such as mechanical stress and humidity stress. Increased mechanical stress due to thermomechanical mismatch among the different materials used in the fabrication of semiconductor dies or due to externally generated stress applied to the semiconductor die after the semiconductor die is placed into a larger system board environment can enhance the rate at which cracks or delamination propagate.

Stress corrosion cracking or delamination can also occur. In addition to mechanical stress, the presence of moisture can greatly accelerate the rate at which cracks or delamination propagate within brittle glass-like thin films, including LKDs and oxides used in semiconductor device fabrication. Also, moisture penetration into the BeoL metallization stack can lead to a significant amount of corrosion damage to the copper and aluminum metallization used. Shorting between such metals can readily occur when corrosion has advanced beyond a certain point.

CMOS-based silicon chips can be somewhat mechanically fragile and prone to significant early failure problems if ambient moisture is not prevented from entering the semiconductor die, either through its sides or from above and into the BeoL metallization stacks. Once moisture has penetrated into the semiconductor die, it can fail quickly due to early electrical breakdown of the LKDs used in the BeoL.

Even though an outright failure of a semiconductor die caused by DEC/DED can be easily detected, such detection is of little benefit if the semiconductor die is no longer within the internal manufacturing environment of the chip producer. Embodiments herein provide DEC and DED detection utilizing one of a via chain resistor or inter-metal capacitor that surrounds the entire semiconductor die at a fixed location at the semiconductor die edge. Placement of a detector inside or outside the semiconductor die protection wall allows detection of a crack or delamination either before or after it has penetrated the protection barriers.

Semiconductor die Mechanical Protection Barriers (MPB), such as a SR or CAS can possibly be used in a detection structure. However, once a DEC/DED has penetrated that far into the semiconductor die, the damage may be already too significant to avoid field reliability risk. Since a DEC/DED continues to grow at all stages of semiconductor die life, it is entirely plausible to expect semiconductor dies to have cracks not detected during typical manufacturing checks or burn-in screening, but to still have a non-trivial risk for failure in the field. Therefore, it is increasingly important to identify when a given DEC/DED is going to have a high likelihood of becoming a fatal event that eventually penetrates through the mechanical/hermetic protection barriers that surround the semiconductor die.

The DEC/DED detector structure can be designed to identify several important characteristics of the DEC/DED that are not found when the DEC/DED detector is placed in a typical fixed location somewhere at the semiconductor die perimeter (usually interior to the semiconductor die). A first characteristic can include the level of pre-existing damage occurring during A&P, due to laser grooving (LG) and/or blade dicing. Also, DEC/DED can exist on one or several metal levels, but maybe only one level achieves a level of critical stress to enable a DEC/DED self-directed propagation towards the internal regions of the semiconductor die.

The location of the DEC/DED can also be detected at the semiconductor die perimeter before the DEC/DED has had an opportunity to reach the semiconductor die MPB using embodiments described herein. Other characteristics include a lateral distance of the DEC/DED crack tip relative to the MPB, a rate of progress of the DEC/DED towards the MPB, and whether the DEC/DED has reached a critical point where the DEC/DED has a high likelihood of breaking through the MPB. Embodiments herein describe the structures associated with detecting these characteristics.

Detection approaches include placing either resistor or capacitor elements at predetermined distances to track the presence of a crack or delamination at the predetermined distance from the MPB. The resistor element can be either a simple single (and thin) metal level line running parallel to the scribe street (or MPB), or a via chain occupying two metal levels to capture local changes in the array resistance due to A&P pre-damage and/or DEC/DED. The capacitor element can be a single in-plane inter-metal line capacitor pair and/or an inter-level capacitor pair to capture local changes in the capacitance due to A&P pre-damage and or DEC/DED.

These detector elements are placed within a given metallization level or set of metallization levels to detect cracks or delamination within that plane of metallization. These arrays are placed onto several metallization levels in the same local region of the semiconductor die edge to detect A&P pre-damage and/or DEC/DED occurring anywhere within the three-dimensional metal stacking that makes up the BeoL layers.

When the detector elements are placed in a parallel array, the failure of one of the detector elements at a predetermined distance from the MPB leads to a characteristic change in the parallel resistance or capacitance of the array as the DEC/DED propagates towards the MPB. When the array registers a change during electrical inspection that is greater than a predetermined threshold, due to an increased DEC/DED field risk (the semiconductor die is still likely to be functional), the semiconductor die can be flagged as a "risky die" and be excluded from the manufacturing pool of shippable parts.

For example, an initial DEC/DED detection resistance can be calculated at t=0 where N=n elements are found in a given metallization level according to the following equations.

$$\frac{1}{R_{Detector}(t=0)} = \frac{1}{R_1} + \frac{1}{R_2} + [] + \frac{1}{R_{n-1}} + \frac{1}{R_{N=n}}$$

$$R_{Detector}(t=0) = \frac{(R_1 \cdot R_2 \cdot R_3 \rfloor \; R_{n-1} \cdot R_{N=n})}{\begin{pmatrix} R_2 \cdot R_3 \rfloor \; R_{n-1} \cdot R_n + R_1 \cdot R_3 \cdot R_4 \rfloor \; R_n + \\ R_1 \cdot R_2 \cdot R_4 \rfloor \; R_n + R_1 \cdot R_2 \rfloor \; R_{n-2} \cdot R_n + R_1 \cdot R_2 \rfloor \; R_{n-2} \cdot R_{n-1} \end{pmatrix}}$$

Out of the initial N=n resistor elements, some fraction of the resistor elements are lost as the DEC/DED grows, and at a time $t_{Damage}$, the DEC/DED resistance increases and can be described by the following equations.

$$\frac{1}{R_{Detector}(t=t_{Damage})} = \frac{1}{R_1} + \frac{1}{R_2} + [] + \frac{1}{R_{n-4}} + \frac{1}{R_{N=n-3}}$$

$$R_{Detector}(t=t_{Damage}) = \frac{(R_1 \cdot R_2 \cdot R_3 \rfloor \; R_{n-4} \cdot R_{N=n-3})}{\begin{pmatrix} R_2 \cdot R_3 \rfloor \; R_{n-4} \cdot R_{n-3} + R_1 \cdot R_3 \cdot R_4 \rfloor \; R_{n-3} + \\ R_1 \cdot R_2 \cdot R_4 \rfloor \; R_{n-3} + R_1 \cdot R_2 \rfloor \; R_{n-5} \cdot R_{n-3} + \\ R_1 \cdot R_2 \rfloor \; R_{n-5} \cdot R_{n-4} \end{pmatrix}}$$

A similar capacitor-based approach can also be used.

In some implementations, the semiconductor die is considered to be a "risky die" When a critical condition occurs that corresponds to $R_{Detector}=R_{Critical}$, which occurs when a predetermined number of elements $N=M_{Critical}$ remain. At the critical condition, the DEC/DED resistance can be described by the following equations.

$$\frac{1}{R_{Detector}(t=t_{FinalCheck})} = \frac{1}{R_1} + \frac{1}{R_2} + [] + \frac{1}{R_{mCrit-1}} + \frac{1}{R_{N=mCrit}}$$

$$R_{Detector}(t=t_{Damage}) = \frac{(R_1 \cdot R_2 \cdot R_3 \rfloor \; R_{n-4} \cdot R_{N-mCrit})}{\begin{pmatrix} R_2 \cdot R_3 \rfloor \; R_{mCrit-1} \cdot R_{mCrit} + R_1 \cdot R_3 \cdot R_4 \rfloor \; R_{mCrit} + \\ R_1 \cdot R_2 \cdot R_4 \rfloor \; R_{mCrit} + R_1 \cdot R_2 \rfloor \; R_{mCrit-2} \cdot R_{mCrit} + \\ R_1 \cdot R_2 \rfloor \; R_{mCrit-2} \cdot R_{mCrit-1} \end{pmatrix}}$$

An implementation with parallel capacitors can be similarly analyzed.

Figure 2:
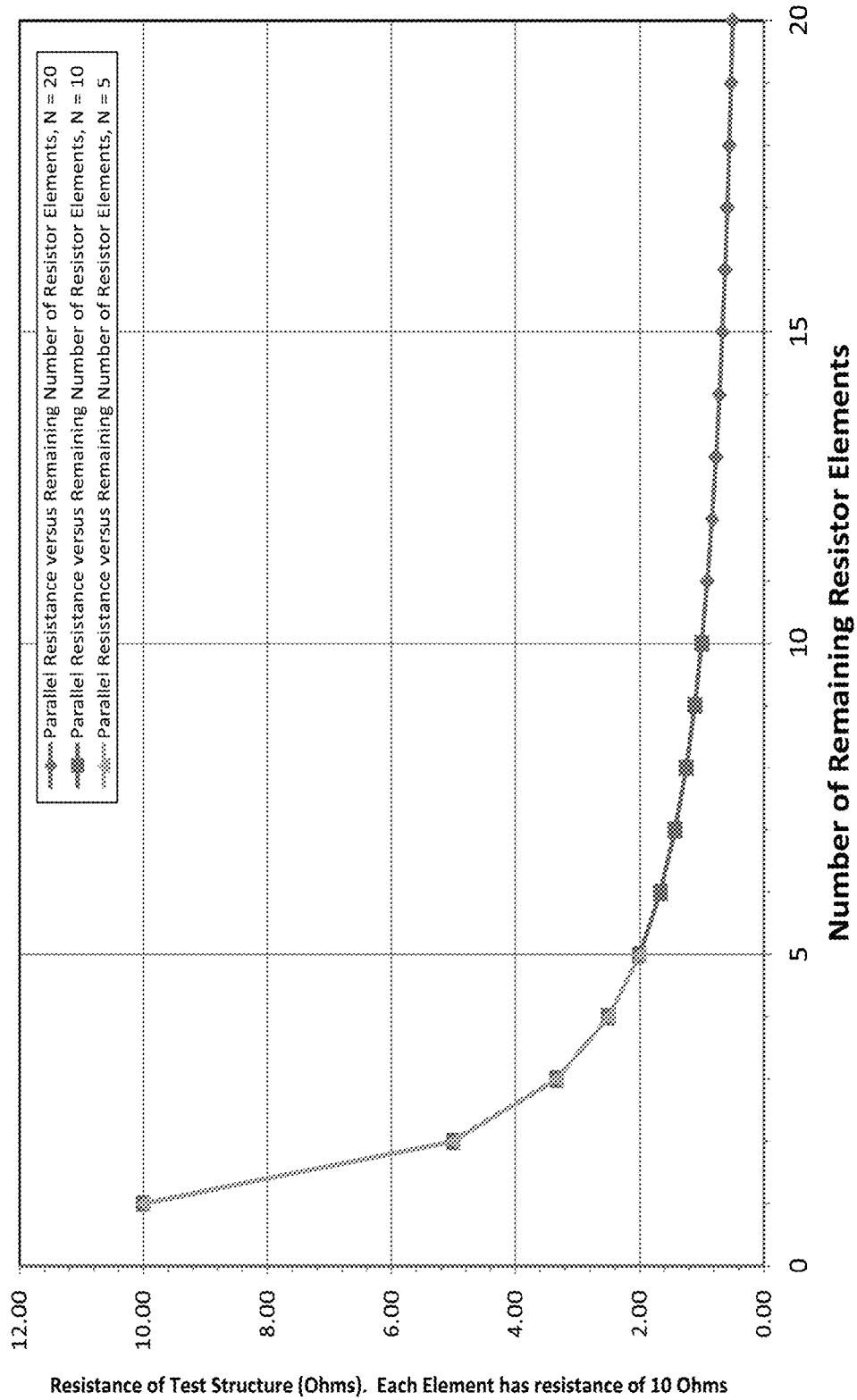
FIG. 2 is a graph of an exemplary resistance change versus number of detection elements, according to certain embodiments.

FIG. 2 is a graph of an exemplary resistance change versus the number of resistor detection elements, according to certain embodiments. In some implementations, the number of resistors installed in the semiconductor die can be five or ten per metal layer of the semiconductor die. When resistors within a given metallization level are properly placed, a significant change in resistance is detected as the DEC/DED destroys a given resistor (i.e., opens it) as it propagates towards the MPB. A change in capacitance versus the number of capacitor detection elements can also be utilized to detect a DEC/DED for embodiments described herein. When the critical locations of detector elements are identified, fewer detector elements are needed to generate a large change in resistance or capacitance.

Figure 3:
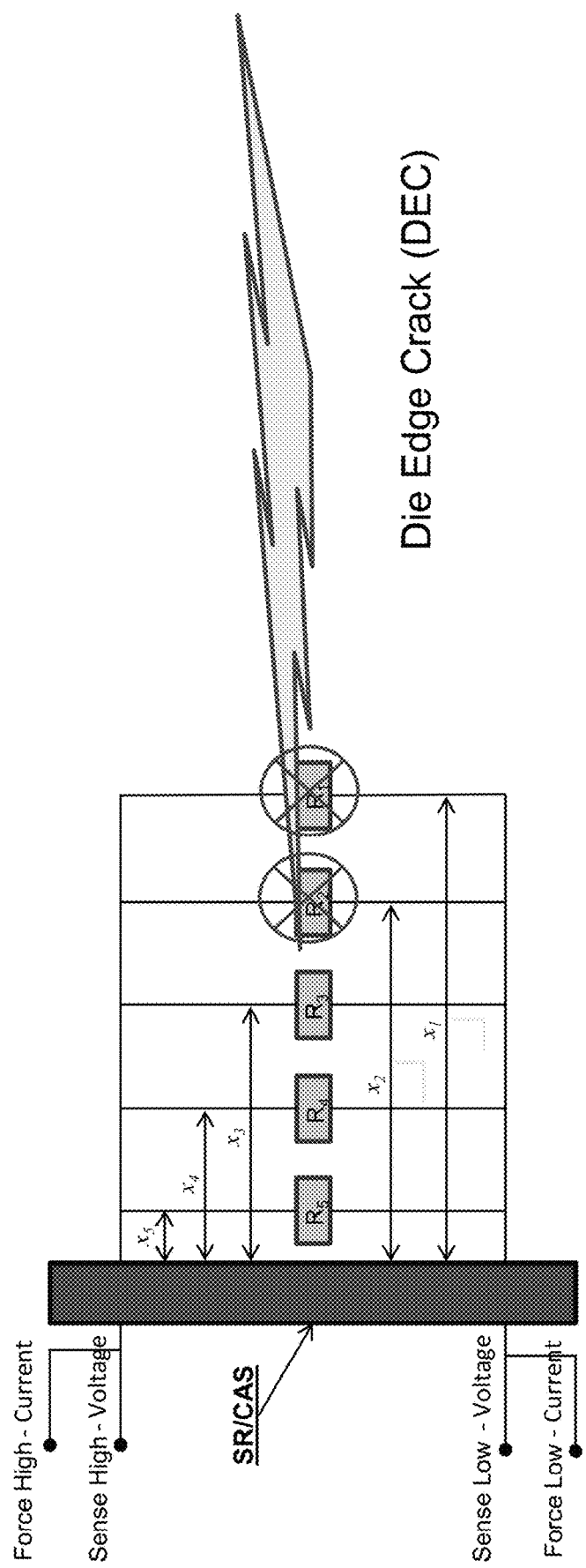
FIG. 3 is a diagram of an exemplary die edge crack propagation detection structure, according to certain embodiments.

FIG. 3 is a diagram of an exemplary DEC/DED detection structure for a metallization layer of a semiconductor die, according to certain embodiments. For example, the DEC/DED detection structure includes five resistive elements ($R_1$, $R_2$, $R_3$, $R_4$, and $R_5$). If the DEC/DED reaches $R_5$ at position $x_5$, the semiconductor die can be considered at risk for early failure. The DEC/DED detection structures in each layer of the semiconductor die are overlaid on top or locally adjacent to each other at all metallization levels, such that three-dimensional crack detection can occur.

FIG. 3 illustrates a DEC has propagated through $R_1$ and $R_2$, which causes an open circuit at those positions. In real implementations in microelectronics, layout of such detection structures will need to be optimized to detect cracks propagating from the physical die edge towards a SR/CAS protection barrier at all possible vulnerable locations along the perimeter of the die. This includes all metal levels because a crack can propagate laterally parallel to the silicon plane and change its path vertically.

In one embodiment, test structures for the DEC/DED detection structure can be evaluated independently for effectiveness using a separate test vehicle that does not require a hermetic seal ring lying just outside detection circuitry. The test structures can be used to optimize the assembly process to minimize the presence of initial damage due to DEC/DED. The test structures can also be used to test for layout sensitivities along the scribe lane of monitor structures, which can lead to enhanced concentrations of DEC/DEDs at certain locations long a die edge.

In a second embodiment, a detection circuit is formed as part of the semiconductor die. In one example, the detection circuit can be formed as part of the MPB. In another example, a detection circuit is placed within the semiconductor die and is electrically connected to the detector structures using higher-level assembly processes, such as copper pillar connections or routing found in a Fan Out Wafer Level Package (FOWLP). In the case of a FOWLP, multiple chips with die edge detection capabilities within the FOWLP can be interconnected for die edge integrity tracking so that the die edge integrity of the composite device of a FOWLP can be checked and maintained. A high current source is driven across the resistor detection array to the low current force. A voltage is measured across the resistor detection array from the high sense voltage to the low sense voltage. The level of complexity and scope of the detection circuit used will also determine the level of sophistication of the DEC/DED detection schemes that can be used.

The detection circuit has circuitry configured to obtain electrical measurements from the four contact points and thereby determine a metallization level of an encroaching DEC or DED, how far the encroaching DEC or DED is from the MPB, and the rate of progression of the encroaching DEC or DED towards the MPB. In one embodiment, the detection circuit can be powered up and powered down to save energy, rather than applying a constant energy supply to the detection circuit.

Unlike conventional edge integrity detection structures, the DEC/DED detection structure described by the present disclosure can be placed just outside the MPB structures or can even be partially incorporated into the MPB structure. In addition, the DEC/DED detection structure can be placed in a manner surrounding the die perimeter to enable detection of DEC/DED at any likely location where risk is significant for DEC/DED failure. Also, the DEC/DED detection structure can have extended features both vertically and laterally to detect, respectively, the presence of DEC/DED at any given metallization level and its relative proximity to the MPBs and can be seamlessly integrated into existing MPB designs as long as adequate space can be allocated for their layout.

DEC/DED detection structures can include several embodiments. The following embodiments are given for illustrative purposes only. Embodiments are not limited to the following illustrations.

Detection structures can be used to identify DEC/DED extent during A&P LG and dicing process optimization and thus, enable efficient and definitive means to improve LG and dicing procedures. Such detection on a test chip enables the entire edge of the semiconductor die to be electrically characterized, which is significantly more sensitive than conventional methods used for optimization.

Detection structures can be used in a semiconductor die product to identify a post-A&P semiconductor die that has a potentially risky DEC/DED that could lead to semiconductor die failure in the field. Embodiments described herein use quantitative electrical measurements instead of gross and inaccurate optical inspection methods currently used. The likelihood of a given extent of subsequent DEC/DED can be determined such that the relative risk can be ascribed to a given level of DEC/DED at a given location at the semiconductor die edge.

Detection structures can be used in a semiconductor die product that is attached at a system level to detect problems with DEC/DED hermeticity when placed under external moisture and mechanical stress at the board level. In addition, higher-level composite devices made from multiple chips of different types (such as a FOWLP design or other multi-chip module structure) can be integrated together so that composite device die edge integrity can be tracked and monitored. Thus, reliability of the semiconductor die can be monitored in real time when mounted on external systems.

Detection structures can be used in a semiconductor die product to monitor the Die Edge Health (DEH) in the field. Such data can be stored internally on-chip for total-life monitoring. If such a semiconductor die is allowed to access the external environment through the Internet, such data can be fed back to the originating semiconductor die company to assess the statistical performance of the detector structures and the integrity of the SR/CAS protections used.

One advantage in the DEC/DED detection structures described by the present disclosure is the structures can track the level location of a DEC/DED, the position of the DEC/DED relative to the SR/CAS edge, and the rate at which the DEC/DED is propagating to the SR/CAS. If detector elements of Multi-Level DEC Detectors (M-LDECD) are incorporated in the SR/CAS, then failure at each stage of the SR/CAS can be documented. Therefore, the entire time and space character of fatal DEC/DEDs are trackable, unlike simpler static structures of a resistive chain via link or multi-level capacitor structures that are placed only at a single location some distance outside/within the SR/CAS or within the chip itself. Such static and simpler structures only detect a problem when they are crossed and cannot identify whether a fatal DEC/DED exists just outside of it.

In some implementations, the DEC/DED detection structure is configured with a parallel-line approach at each metal level of the semiconductor die. With the parallel line approach, detector structures are inherently parallel along a single metal level to detect DEC/DED along a single interconnect metal level. However, detector structures could also be implemented on multiple levels on different structures so that DEC/DED at different metallization levels are trackable, even in the same local area of the semiconductor die edge.

Figure 4:
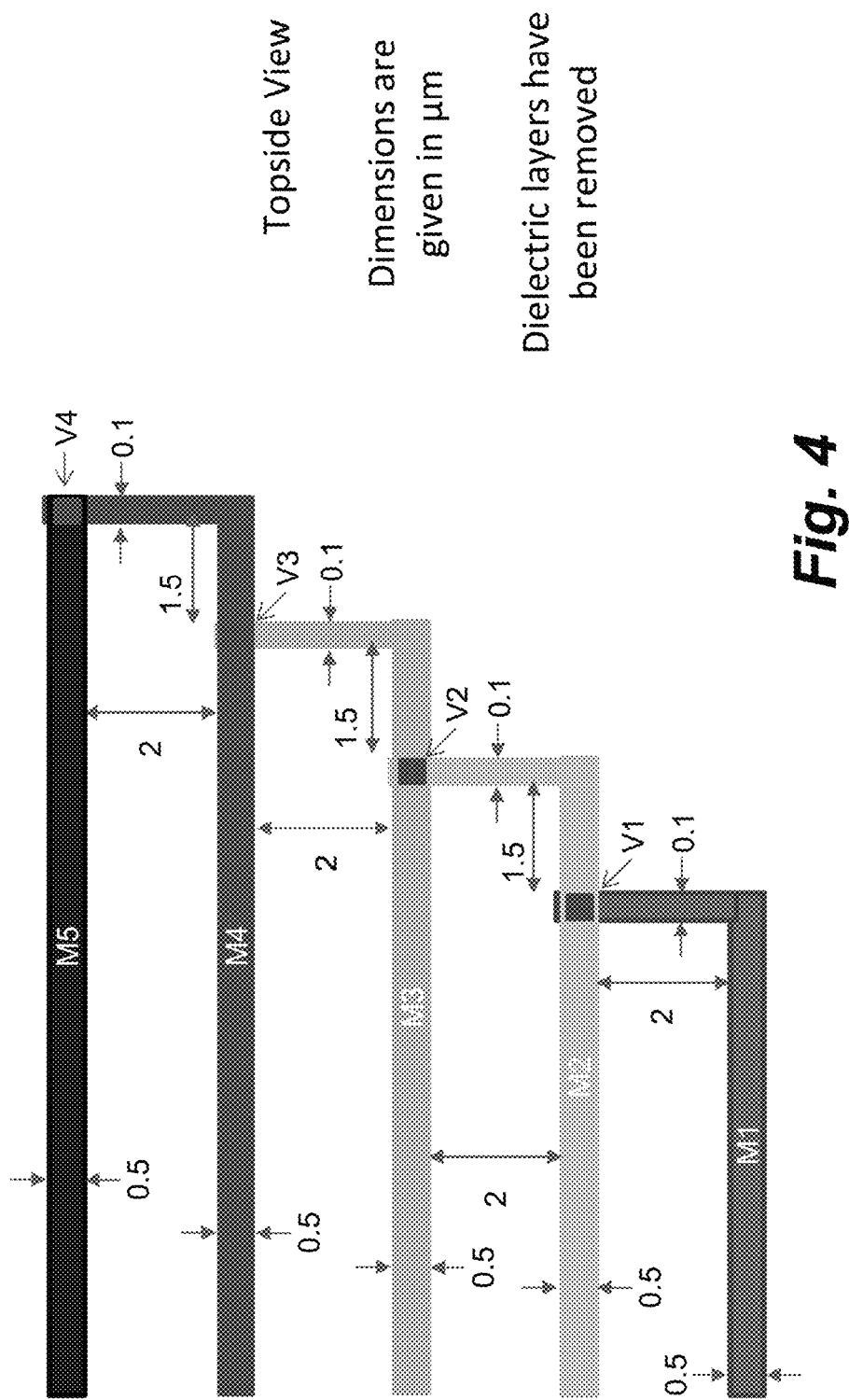
FIG. 4 is a diagram of a top layout view of an exemplary DEC detection structure, according to certain embodiments.

FIG. 4 is a diagram of a top side view of an exemplary DEC/DED detection Structure A, according to certain embodiments. The Structure A includes five parallel metal lines M1, M2, M3, M4, and M5 that extend away from the SR/CAS towards the physical die edge. The five metal lines M1-M5 are staggered atop one another with each metal correspondingly connected below by a via (or via array) to its adjacent lower metal level. In one embodiment, the via or via array is a via chain resistor located between the two adjacent metallization layers. In a second embodiment, the via or via array is an inter-level capacitor pair located between the two adjacent metallization layers. The ends with the via correspond to the outer extent of the Structure A cell that is closest to the physical die edge. However, embodiments described herein are not limited to this configuration. Labeled dimensions are given in micrometers. The labeled dimensions are given for illustrative purposes only; other dimensions are contemplated by embodiments described herein.

Figure 5:
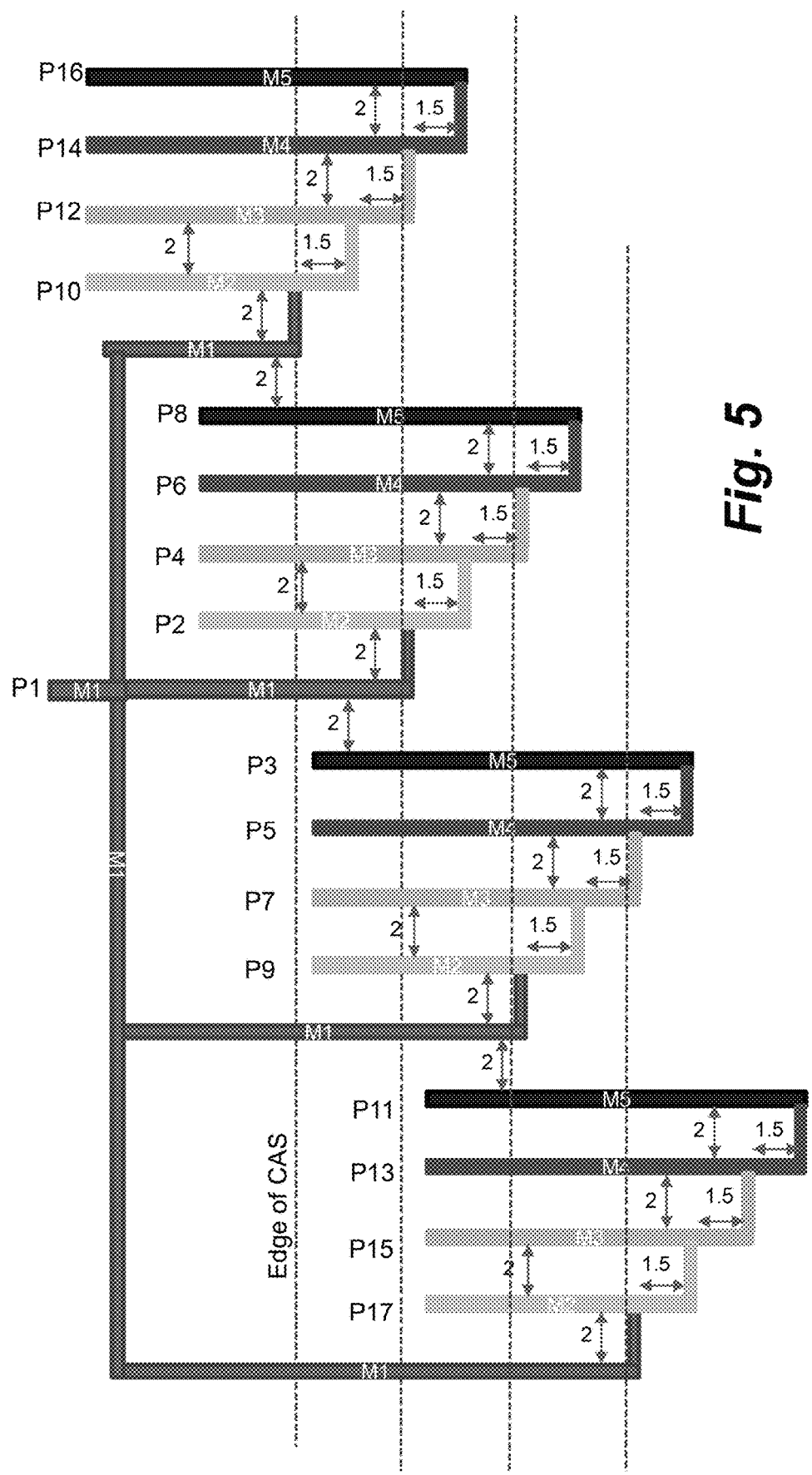
FIG. 5 is a diagram of a top layout view of exemplary multiple DEC detection structures on a semiconductor die, according to certain embodiments.

FIG. 5 is a diagram of a perspective view of exemplary multi-array version of DEC/DED detection structures (Structure A). The detection structures illustrated are placed at different lateral distances away from the SR/CAS to track different overall distance ranges from one structure to another. Since a crack front from a DED is typically much wider than a typical detector, multiple array structures placed judiciously across a die can extensively cover chip edges for DEC/DED issues. The perspective view of FIG. 5 illustrates four detection structures adjacent to each other. FIG. 5 also illustrates a stacked arrangement of the five metal lines of each Structure A. From a top view, the five metal lines would be stacked one on top of another; therefore, only metal line M5 would be visible for each Structure A from a top view.

In FIG. 5, seventeen connection points P1-P17 are used to interconnect the associated metal lines. FIG. 5 just illustrates the interconnection of metal lines M1 at P1 connection juncture for ease of illustration. The different locations of the Structure A arrays can track the progress of a crack front at different points in time as the crack front approaches a SR/CAS barrier. Typically, since the via levels have lower metal density, those layers are more susceptible to crack propagation effects than are the metal levels. Therefore, failures at via junctions between adjacent metal levels are likely levels to detect crack propagation. In FIG. 5, metal layers M1-V1-M2 are tracked by points P17, P9, P2, and P10, relative to P1. (The intersection of M1-V1-M2 is illustrated in FIG. 4.) Since P17 is furthest out from the SR/CAS, it will detect a crack that hits the M1-V1-M2 layer first, while P9 tracks it when the second outermost Structure A at that metal level is impacted, and so on. The dashed lines represent the offset of one detection structure to the next adjacent detection structure.

Damage along a copper metal nitrogen-rich capping dielectric may trigger a subsequent via opening. The capping dielectric should have a lower degradation temperature than the copper melting temperature. Damage from a DEC/DED may occur, due to mechanical failure of a crossing via. Via resistance will be higher than having a vertical metal runner; however, it should not hamper detectability.

FIG. 6A is a diagram of a side view of an exemplary DEC/DED detection Structure B. Structure B has a via interconnecting each metal line to its adjacent metal line. Each metal line functions like a "finger" that extends from the region just outside the SR/CAS towards the physical die edge. The electrical connections between each metal finger relative to the M1 finger (or adjacent metal level finger) will allow detection of a crack at a given metal level based on the change of resistance of the finger Structure B. The vias interconnecting two adjacent metal lines provide detection of a DEC or DED propagating between two vertically-aligned metal lines. For example, the via between M1 and M2 would detect a DEC or DED propagating laterally between M1 and M2. The via between M2 and M3 would detect a DEC or DED propagating laterally between M2 and M3. The via between M3 and M4 would detect a DEC or DED propagating laterally between M3 and M4. The via between M4 and M5 would detect a DEC or DED propagating laterally between M4 and M5. FIG. 6B is a top view of a DEC/DED detection structure of an array of Structure B cells that enable tracking of a crack front progression at the die edge as well as its location along the metal stack.

Two serial vias can be used in a horizontal direction for enhanced granularity w/o sacrificing testability. All M1 lines are connected together and connect to P1; the rest of the pad connections are the same as in Structure A.

Figure 7:
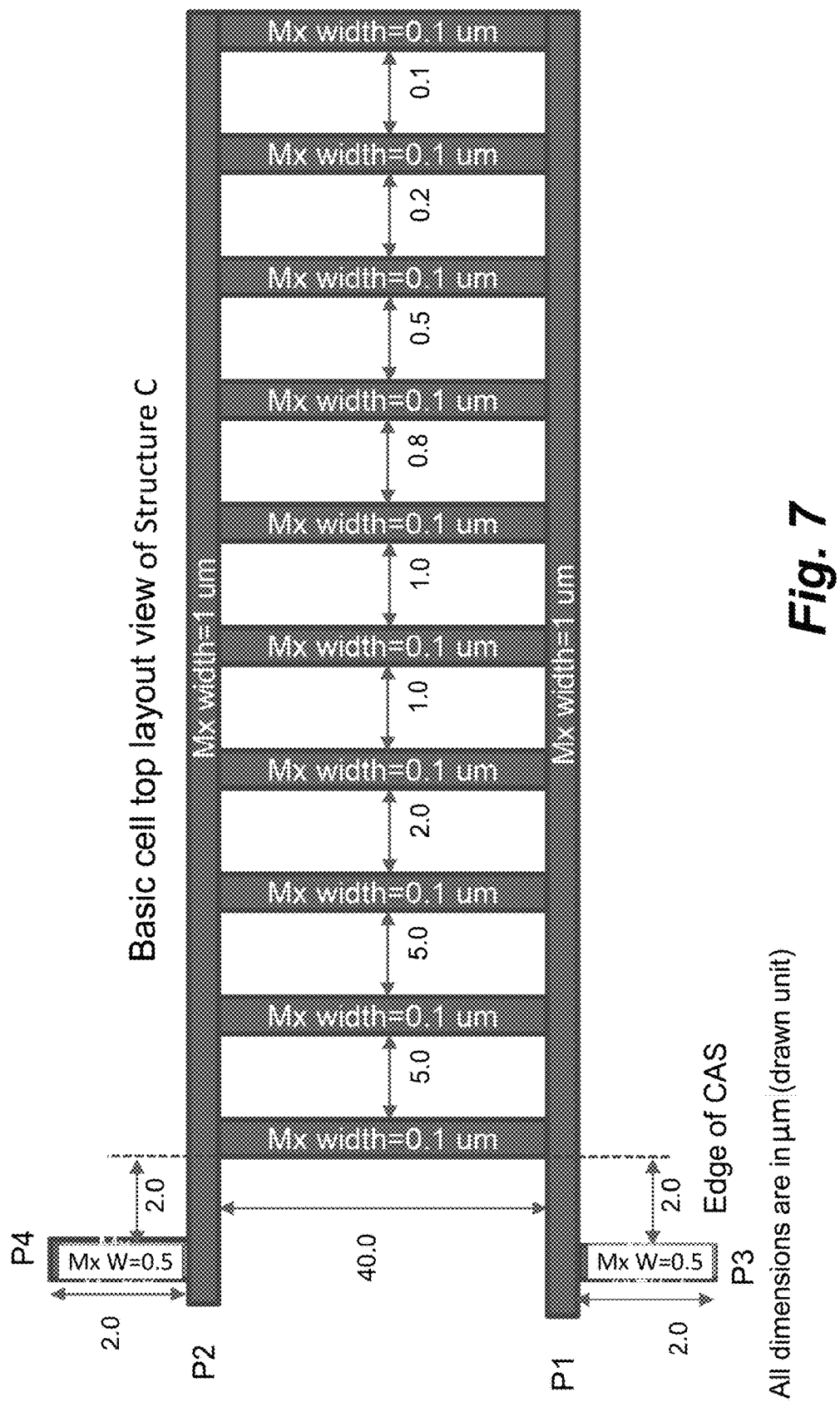
FIG. 7 is a diagram of a top layout view of an exemplary DEC/DED detection Structure C, according to certain embodiments.

FIG. 7 is a diagram of a top layout view of an exemplary DEC/DED detection Structure C, according to certain embodiments. FIG. 7 illustrates the layout and interconnection to other metal lines within Structure C. P1, P2, P3, and P4 junctions shown for the example Mx layer enable measurement of Structure C using conventional 4-point Van der Pauw type resistance monitoring. From a lower metal to an upper metal, the same pattern is repeated to create a layer-by-layer stacking of detector elements that make up Structure C. As a crack front propagates towards the SR/CAS from the physical die edge and changes levels from $M_x$ to $M_{x+1}$, for example, the resistance of $M_x$ and $M_{x+1}$ elements will change and thus track the vertical and lateral evolution of the crack front. Dimensions are given in micrometers. Dimensions are given for illustrative purposes only. Embodiments described herein are not limited to the illustrated dimensions or structural layout.

Figure 8:
FIG. 8 is a diagram illustrating test pads used for testing detection Cell Structure A, Cell Structure B, and Cell Structure C, according to certain embodiments.
Figure 8:
Figure 8:

FIG. 8 is a diagram illustrating test pads used for testing detection. Cell Structure A, Cell Structure B, and Cell Structure C, according to certain embodiments. The pad array is used to make an electrical connection to the individual structures in a test chip arrangement to test the effectiveness of the detector structures. The pad array is placed along a die edge along an interior street between adjacent die. Multiple die are diced together as an array cluster so that interior die streets can be used to place these pad arrays. The test structures are placed along the outer perimeters of an array of die to check for die crack propagation, and they are electrically connected to these pad arrays for measurement. The layout can be similar to connectivity of DEC detectors in advanced packaging, where multiple chips are housed together in a complex packaging arrangement and are electrically connected to one another.

Figure 9:
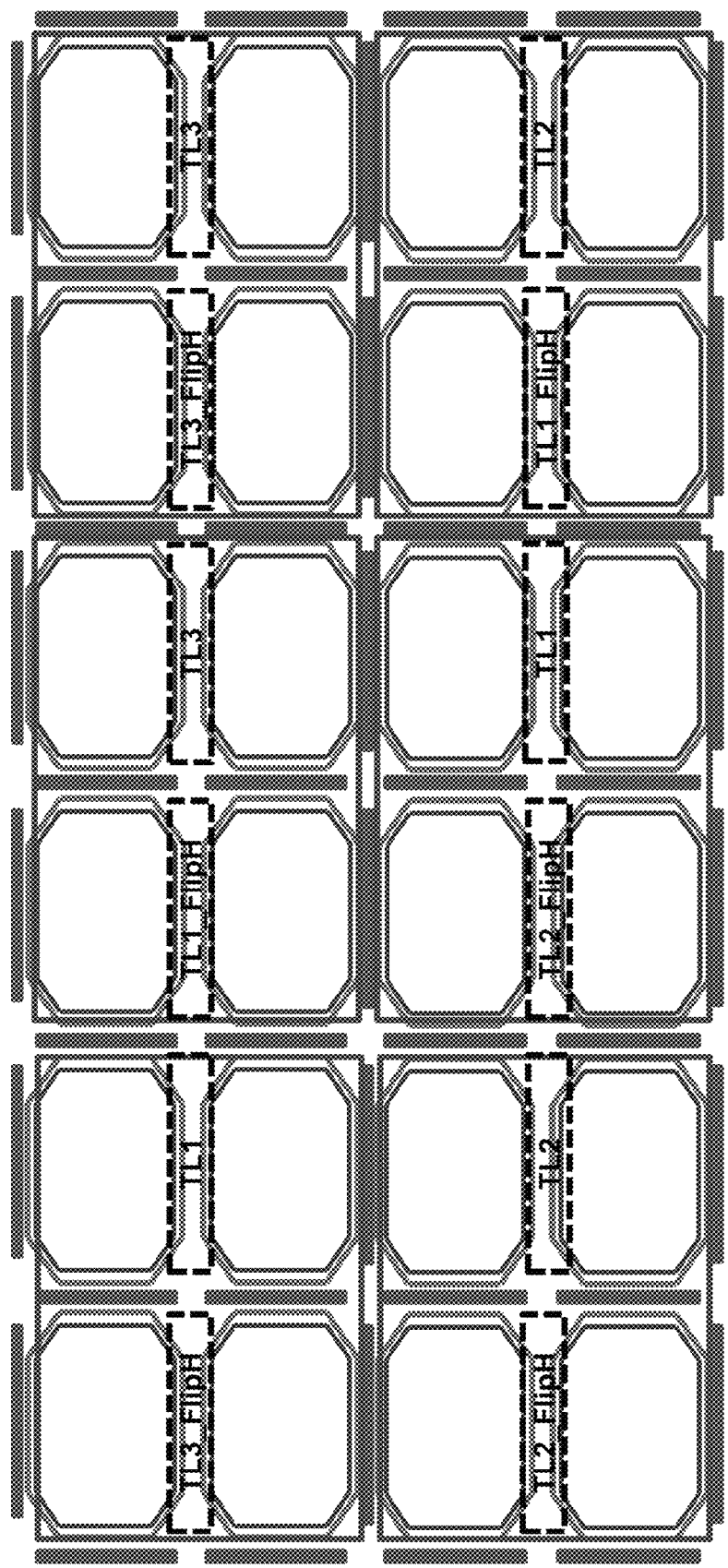
FIG. 9 illustrates test pads embedded within an array of a semiconductor die used to demonstrate proof of concept of these ideas about a die edge protection without alteration of a given standard design for a chip SR/CAS, according to certain embodiments.

FIG. 9 illustrates the test pads of FIG. 8 embedded within an array of semiconductor die as described previously in FIG. 8. The test pads of FIG. 9 test detector structures without any modifications to general SR/CAS designs. In FIG. 9, an array of four test die is arranged with test pads located along interior streets of the array. The test pads make an electrical connection to crack detector structures placed along the outer edges of the 2×2 chip array, such that the detector structures can detect crack problems found along the perimeter of the chip array. This arrangement could also be used to optimize assembly processes for improved die edge quality against potential DEC issues.

Laser Groove (LG) damage across the street of a chip can be asymmetric, due to asymmetries inherent to existing LG process methodology. Lateral Heat Damage (LHD) generated in post-LG appears to be derived from two factors. A first factor is selectively stronger LG absorption in N-containing dielectric films and/or Cu metallization. A second factor is lateral heat propagation from LG heating by Cu metallization. LHD indicates that two-level via-connected structures may provide additional testability benefit to detect LHD and DEC.

Figure 10:
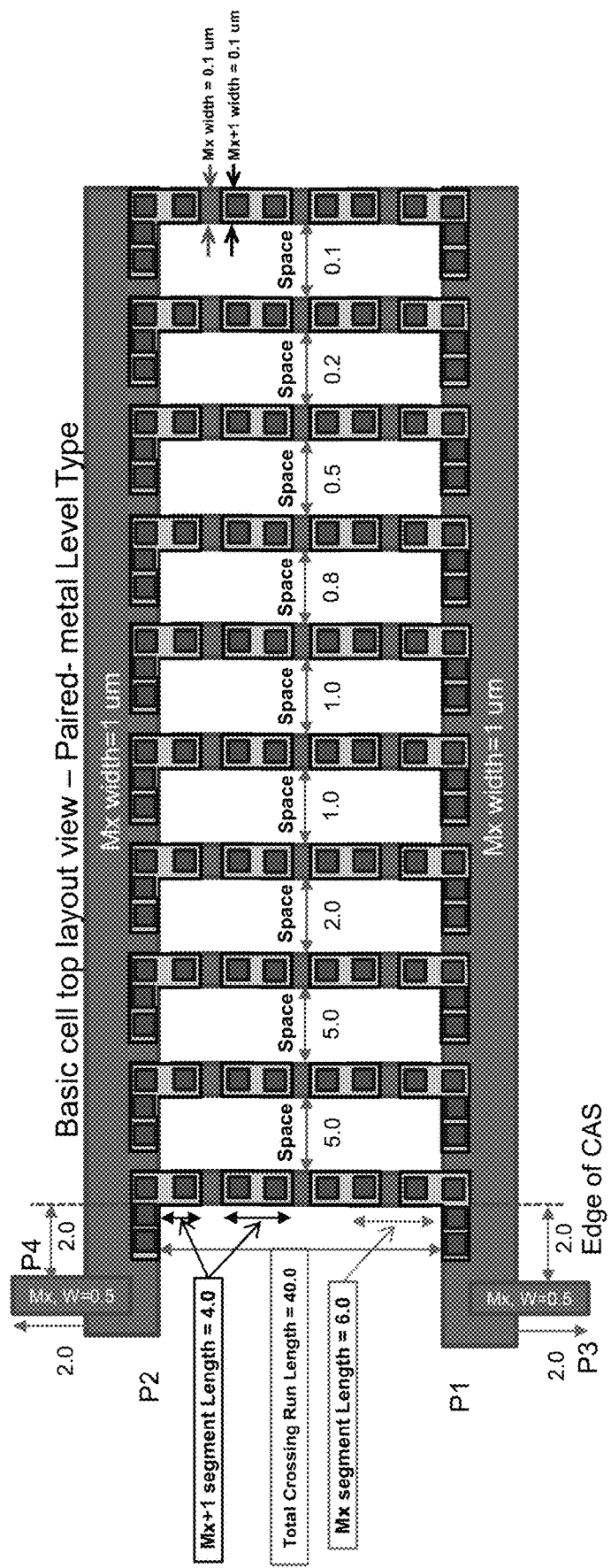
FIG. 10 is a diagram of a top layout view of an exemplary DEC/DED detection Structure D, according to certain embodiments.

FIG. 10 is a diagram of a top layout view of an exemplary DEC/DED detection Structure D, according to certain embodiments. All dimensions are in μm (drawn unit) and are meant to be illustrative. Detection Structure D detects damage on a given Mx<Vx–Mx+1 layer combination. Usable pairs are (x,x+1)=(1,2), (3,4), (5,6). Metal line M6 here would be thicker than normally used, so the dimensions will need to be changed for (5,6) combo. Stack paired structures Mx to Mx+1 are on top of each other. Each paired metal layer structure has four connections, which amounts to a total of twelve connections for six metal layers covered. The example shown in FIG. 10 is suitable for M1-V1-M2 pairing, and connections can be made for (M3,M4) and (M5,M6).

Figure 11:
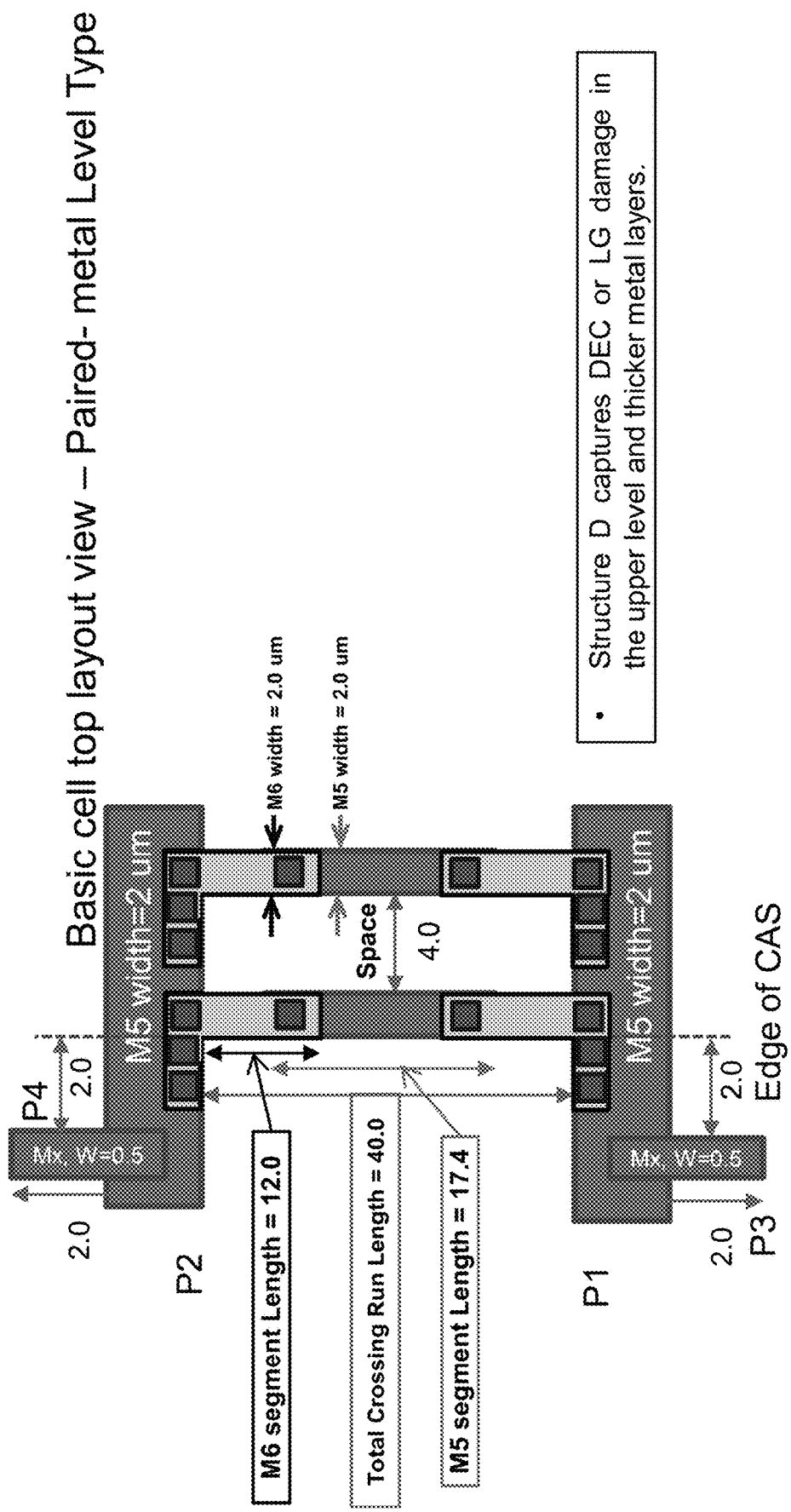
FIG. 11 is a diagram of a top layout view of an exemplary paired metal parallel bridge for Structure D, according to certain embodiments.

FIG. 11 is a diagram of an exemplary paired metal parallel bridge (M5, M6 pair) for the Structure D DEC/DED detection structure, according to certain embodiments. Structure D detects damage on a given M5-V5-thicker layer combination. M5-V5-thicker layer combination uses only two bridge elements so that only damage closest to the CAS edge is tracked. This attempts to limit thicker layer interaction with the LG beam farther out from the CAS, which might impact lower level paired bridge structures. M5-V5-thicker layer bridge lies above the lower-level paired metal bridge pairs. Each paired metal layer structure has four connections. A total of twelve connections for six metal layers are covered for all three pairings. For additional metal stackings of greater complexity, the layout of Structure D can be modified pair-wise to detect crack propagation along all the metal levels of interest.

Figure 12:
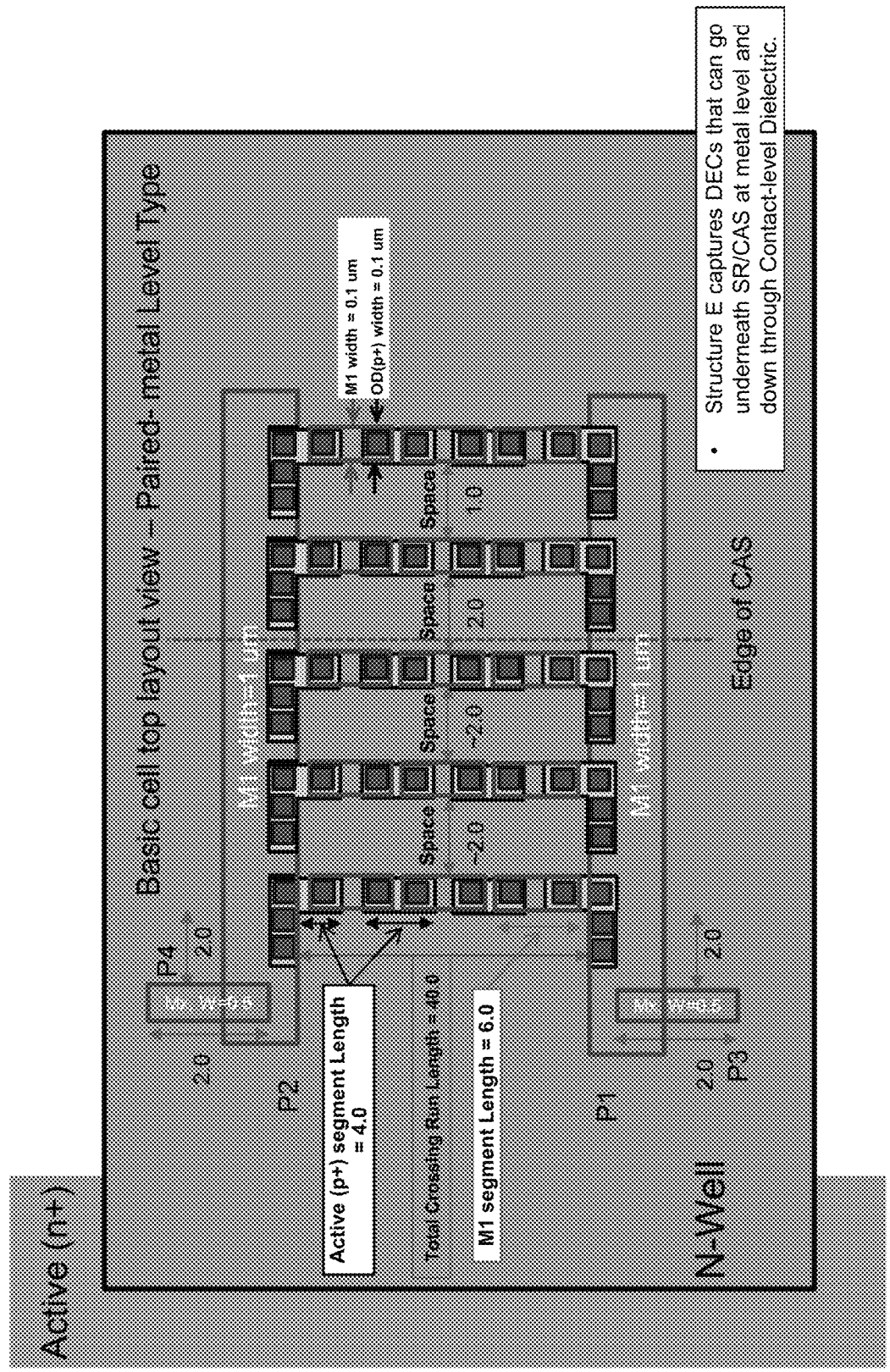
FIG. 12 is a diagram of a top layout view of an exemplary DEC/DED detection Structure E, according to certain embodiments.

FIG. 12 is a diagram of a top layout view of an exemplary DEC/DED detection Structure E, according to certain embodiments. Structure E captures DEC/DEDs that can go underneath the SR/CAS at a metal level and down through a contact-level dielectric. Structure E forms part of the stacked paired-layers of structures in structure D. Structure E is embedded underneath the CAS and forms part of the CAS, but only where vias are used and not at a contact trench.

FIG. 13 is a flowchart for an exemplary method 1300 of detecting a crack or delamination in a semiconductor chip. In step S1310, a first electrical measurement reading is received, via a detection circuit of the semiconductor chip, from a first passive electronic device located within a first metallization layer of the semiconductor chip.

In step S1320, it is determined whether the first electrical measurement reading is outside a first nominal designed range for the first passive electronic device. In one embodiment, the first passive electronic device is one of a single in-plane metal line resistor or a via chain resistor located between the first and second metallization layers. In a second embodiment, the first passive electronic device is one of a single in-plane metal line capacitor or an inter-level capacitor pair located between the first and second metallization layers.

In step S1330, a location and time of the first electrical measurement reading is saved for the first passive electronic device when the first electrical measurement reading registers outside of the first nominal designed range. For example, a reading indicating an open circuit of a resistor would register outside of the nominal designed range of the resistor.

In step S1340, a second electrical measurement reading is received, via the detection circuit of the semiconductor chip, from a second passive electronic device located within a second metallization layer of the semiconductor chip. The second electrical measurement reading registers outside of a second nominal designed range for the second passive electronic device.

In step S1350, a rate of progression is determined from the first electrical measurement reading registering outside of the first nominal designed range and the second electrical measurement reading registering outside of the second nominal designed range. In one embodiment, the rate of progression is determined for a crack or delamination within the semiconductor chip.

Embodiments described herein include the following aspects.

(1) A die edge crack and delamination detection device includes a semiconductor device including an integrated circuit (IC) active area surrounded by at least one mechanical protection barrier (MPB); one or more metallization layers stacked on the IC active area; a plurality of passive electronic devices placed within the one or more metallization layers at respective predetermined distances from the MPB; and a detection circuit having circuitry. The circuitry is configured to determine a specific metallization layer in which a crack or a delamination is encroaching from an edge of the semiconductor device, determine a lateral distance of a lead end of the crack or the delamination from the MPB, and determine a rate of approach of the crack or the delamination encroaching towards the MPB, wherein determining the specific metallization layer, the lateral distance, and the rate of approach are determined via a nominal change in an electrical measurement of at least one of the passive electronic devices.

(2) The die edge crack and delamination detection device of (1), wherein the plurality of passive electronic devices includes a plurality of resistors.

(3) The die edge crack and delamination detection device of either (1) or (2), wherein the plurality of resistors includes one or more of a single in-plane metal line resistor or a via chain resistor located between two metallization layers.

(4) The die edge crack and delamination detection device of any one of (1) through (3), wherein the circuitry is further configured to determine a number of remaining working resistors from a total measured resistance of the plurality of resistors.

(5) The die edge crack and delamination detection device of any one of (1) through (4), wherein the plurality of passive electronic devices includes a plurality of capacitors.

(6) The die edge crack and delamination detection device of any one of (1) through (5), wherein the plurality of capacitors includes one or more of a single in-plane metal line capacitor or an inter-level capacitor pair located between two metallization layers.

(7) The die edge crack and delamination detection device of any one of (1) through (6), wherein the respective predetermined distances form an array of passive electronic devices within each of the metallization layers.

(8) The die edge crack and delamination detection device of any one of (1) through (7), wherein the detection circuit is electrically connected to the plurality of passive electronic devices.

(9) A die edge crack and delamination detection semiconductor package includes a plurality of interconnected semiconductor devices, wherein each of the semiconductor devices includes an integrated circuit (IC) active area surrounded by at least one mechanical protection barrier (MPB); one or more metallization layers stacked on each of the IC active areas; a plurality of passive electronic devices placed within the one or more metallization layers at respective predetermined distances from each of the MPBs; and a detection circuit. The detection circuit includes circuitry configured to determine a specific metallization layer in which a crack or a delamination is encroaching from an edge of each of the semiconductor devices, determine a lateral distance of a lead end of the crack or the delamination from each of the MPBs, and determine a rate of approach of the crack or the delamination encroaching towards each of the MPBs, wherein determining the specific metallization layer, the lateral distance, and the rate of approach are determined via a nominal change in an electrical measurement of at least one of the passive electronic devices within an associated semiconductor device for each of the semiconductor devices.

(10) The die edge crack and delamination detection semiconductor package of (9), wherein the die edge crack and delamination detection semiconductor package comprises a Fan Out Wafer Level Package.

(11) The die edge crack and delamination detection semiconductor package of either (9) or (10), wherein the plurality of passive electronic devices includes a plurality of resistors within each of the semiconductor devices.

(12) The die edge crack and delamination detection semiconductor package of any one of (9) through (11), wherein the plurality of passive electronic devices includes a plurality of capacitors within each of the semiconductor devices.

(13) The die edge crack and delamination detection semiconductor package of any one of (9) through (12), wherein the detection circuit is electrically connected to the plurality of passive electronic devices within each of the semiconductor devices.

(14) A method of detecting a crack or delamination includes receiving a first electrical measurement reading, via a detection circuit of a semiconductor chip, from a first passive electronic device located within a first metallization layer of the semiconductor chip; determining whether the first electrical measurement reading is outside a first nominal designed range for the first passive electronic device; saving a location and time of the first electrical measurement reading for the first passive electronic device when the first electrical measurement reading registers outside of the first nominal designed range; receiving a second electrical measurement reading, via the detection circuit of the semiconductor chip, from a second passive electronic device located within a second metallization layer of the semiconductor chip, wherein the second electrical measurement reading registers outside of a second nominal designed range for the second passive electronic device; and determining a rate of progression from the first electrical measurement reading registering outside of the first nominal designed range and the second electrical measurement reading registering outside of the second nominal designed range.

(15) The method of detecting a crack or delamination of (14), wherein determining the rate of progression includes determining the rate of progression from the first passive electronic device to the second passive electronic device of a crack or delamination within the semiconductor chip.

(16) The method of detecting a crack or delamination of either (14) or (15), wherein the rate of progression is determined by a difference in time between a first measured open circuit of the first passive electronic device and a second measured open circuit of the second passive electronic device.

(17) The method of detecting a crack or delamination of any one of (14) through (16), wherein the first passive electronic device and the second passive electronic device include one or more of a single in-plane metal line resistor or a via chain resistor located between the first and second metallization layers.

(18) The method of detecting a crack or delamination of any one of (14) through (17), wherein the rate of progression is determined by a difference in time between a first measured change in capacitance of the first passive electronic device and a second measured change in capacitance of the second passive electronic device.

(19) The method of detecting a crack or delamination of any one of (14) through (18), wherein the first passive electronic device and the second passive electronic device include one or more of a single in-plane metal line capacitor or an inter-level capacitor pair located between the first and second metallization layers.

(20) The method of detecting a crack or delamination of any one of (14) through (19), wherein the first metallization layer differs from the second metallization layer.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes, and algorithms described herein may be performed in hardware or software executed by hardware, including computer processors and/or programmable circuits configured to execute program code and/or computer instructions to execute the functions, processes, and algorithms described herein. Additionally, an implementation may be performed on modules or hardware not identical to those described. Accordingly, other implementations are within the scope that may be claimed.

The foregoing discussion describes merely exemplary embodiments of the present disclosure. As will be understood by those skilled in the art, the present disclosure may be embodied in other specific forms without departing from the spirit or essential characteristics thereof. Accordingly, the disclosure is intended to be illustrative, but not limiting of the scope of the disclosure, as well as the claims. The disclosure, including any readily discernible variants of the teachings herein, defines in part, the scope of the foregoing claim terminology such that no inventive subject matter is dedicated to the public.

The invention claimed is:

1. A die edge crack and delamination detection device, comprising:
   a semiconductor device including an integrated circuit (IC) active area surrounded by at least one mechanical protection barrier (MPB);
   one or more metallization layers stacked on the IC active area;
   a plurality of passive electronic devices placed within the one or more metallization layers at respective predetermined distances from the MPB; and
   a detection circuit having circuitry configured to determine a specific metallization layer in which a crack or a delamination is encroaching from an edge of the semiconductor device, determine a lateral distance of a lead end of the crack or the delamination relative to the MPB, and determine a rate of approach of the crack or the delamination encroaching relative to the MPB, wherein determining the specific metallization layer, the lateral distance, and the rate of approach are determined via a nominal change in an electrical measurement of at least one of the passive electronic devices.

2. The die edge crack and delamination detection device of claim 1, wherein the plurality of passive electronic devices includes a plurality of resistors.

3. The die edge crack and delamination detection device of claim 2, wherein the plurality of resistors includes one or more of a single in-plane metal line resistor or a via chain resistor located between two metallization layers.

4. The die edge crack and delamination detection device of claim 2, wherein the circuitry is further configured to determine a number of remaining working resistors from a total measured resistance of the plurality of resistors.

5. The die edge crack and delamination detection device of claim 1, wherein the plurality of passive electronic devices includes a plurality of capacitors.

6. The die edge crack and delamination detection device of claim 5, wherein the plurality of capacitors includes one or more of a single in-plane metal line capacitor or an inter-level capacitor pair located between two metallization layers.

7. The die edge crack and delamination detection device of claim 1, wherein the respective predetermined distances form an array of passive electronic devices within each of the metallization layers.

8. The die edge crack and delamination detection device of claim 1, wherein the detection circuit is electrically connected to the plurality of passive electronic devices.

9. A die edge crack and delamination detection semiconductor package, comprising:

a plurality of interconnected semiconductor devices, wherein each of the semiconductor devices includes an integrated circuit (IC) active area surrounded by at least one mechanical protection barrier (MPB);

one or more metallization layers stacked on each of the IC active areas;

a plurality of passive electronic devices placed within the one or more metallization layers at respective predetermined distances from each of the MPBs; and a detection circuit having circuitry configured to
determine a specific metallization layer in which a crack or a delamination is encroaching from an edge of each of the semiconductor devices, determine a lateral distance of a lead end of the crack or the delamination relative to each of the MPBs, and determine a rate of approach of the crack or the delamination encroaching relative to each of the MPBs, wherein determining the specific metallization layer, the lateral distance, and the rate of approach are determined via a nominal change in an electrical measurement of at least one of the passive electronic devices within an associated semiconductor device for each of the semiconductor devices.

10. The die edge crack and delamination detection semiconductor package of claim 9, wherein the die edge crack and delamination detection semiconductor package comprises a Fan Out Wafer Level Package.

11. The die edge crack and delamination detection semiconductor package of claim 9, wherein the plurality of passive electronic devices includes a plurality of resistors within each of the semiconductor devices.

12. The die edge crack and delamination detection semiconductor package of claim 9, wherein the plurality of passive electronic devices includes a plurality of capacitors within each of the semiconductor devices.

13. The die edge crack and delamination detection semiconductor package of claim 9, wherein the detection circuit is electrically connected to the plurality of passive electronic devices within each of the semiconductor devices.

14. A method of detecting a crack or delamination, the method comprising:

receiving a first electrical measurement reading, via a detection circuit of a semiconductor chip, from a first passive electronic device located within a first metallization layer of the semiconductor chip;

determining whether the first electrical measurement reading is outside a first nominal designed range for the first passive electronic device;

saving a location and time of the first electrical measurement reading for the first passive electronic device when the first electrical measurement reading registers outside of the first nominal designed range;

receiving a second electrical measurement reading, via the detection circuit of the semiconductor chip, from a second passive electronic device located within a second metallization layer of the semiconductor chip, wherein the second electrical measurement reading registers outside of a second nominal designed range for the second passive electronic device; and determining a rate of progression from the first electrical measurement reading registering outside of the first nominal designed range and the second electrical measurement reading registering outside of the second nominal designed range.

15. The method of claim 14, wherein determining the rate of progression includes determining the rate of progression from the first passive electronic device to the second passive electronic device of a crack or delamination within the semiconductor chip.

16. The method of claim 15, wherein the rate of progression is determined by a difference in time between a first measured open circuit of the first passive electronic device and a second measured open circuit of the second passive electronic device.

17. The method of claim 16, wherein the first passive electronic device and the second passive electronic device include one or more of a single in-plane metal line resistor or a via chain resistor located between the first and second metallization layers.

18. The method of claim 15, wherein the rate of progression is determined by a difference in time between a first measured change in capacitance of the first passive electronic device and a second measured change in capacitance of the second passive electronic device.

19. The method of claim 18, wherein the first passive electronic device and the second passive electronic device include one or more of a single in-plane metal line capacitor or an inter-level capacitor pair located between the first and second metallization layers.

20. The method of claim 14, wherein the first metallization layer differs from the second metallization layer.

\* \* \* \* \*